US011417537B2

(12) United States Patent
Mehrotra et al.

(10) Patent No.: US 11,417,537 B2
(45) Date of Patent: *Aug. 16, 2022

(54) METHODS OF ETCHING METAL-CONTAINING LAYERS

(71) Applicant: Applied Materials, Inc., Santa Clara, CA (US)

(72) Inventors: Akhil Mehrotra, Sunnyvale, CA (US); Gene S. Lee, San Jose, CA (US); Abhijit Patil, San Jose, CA (US); Shan Jiang, San Jose, CA (US); Zohreh Hesabi, San Jose, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 17/197,757

(22) Filed: Mar. 10, 2021

(65) Prior Publication Data

US 2021/0193481 A1 Jun. 24, 2021

Related U.S. Application Data

(63) Continuation of application No. 16/828,751, filed on Mar. 24, 2020, now Pat. No. 10,957,558, which is a (Continued)

(51) Int. Cl.
*H01L 21/321* (2006.01)
*H01L 21/3213* (2006.01)
(Continued)

(52) U.S. Cl.
CPC .. *H01L 21/32137* (2013.01); *H01L 21/28562* (2013.01); *H01L 21/3065* (2013.01); *H01L 21/31122* (2013.01); *H01L 21/32136* (2013.01)

(58) Field of Classification Search
CPC ......... H01L 21/32137; H01L 21/28562; H01L 21/3065; H01L 21/31122; H01L 21/32136
(Continued)

(56) References Cited

U.S. PATENT DOCUMENTS 5,338,398 A 8/1994 Szwejkowski et al.
8,980,763 B2 3/2015 Wang et al.
(Continued)

FOREIGN PATENT DOCUMENTS

WO 2017099718 A1 6/2017

*Primary Examiner* — Duy Vu N Deo
(74) *Attorney, Agent, or Firm* — Patterson + Sheridan, LLP

(57) ABSTRACT

A method of removing a metal-containing layer (e.g., tungsten) from a substrate is provided. The method includes generating a first plasma in a process volume of a plasma chamber when a patterned device is disposed on a substrate support in the process volume. The patterned device includes a patterned region and an unpatterned region; a substrate; a tungsten-containing layer formed over the substrate; a supporting layer disposed between the tungsten-containing layer and the substrate. The patterned region includes exposed surfaces of the supporting layer and the unpatterned region does not include any exposed surfaces of the supporting layer. The method further includes depositing a first film over the patterned region of the tungsten-containing layer with the first plasma; and removing portions of the unpatterned region of the tungsten-containing layer with the first plasma without depositing the first film over the unpatterned region.

20 Claims, 6 Drawing Sheets

Related U.S. Application Data continuation of application No. 16/141,777, filed on Sep. 25, 2018, now Pat. No. 10,636,675.

(60) Provisional application No. 62/597,163, filed on Dec. 11, 2017, provisional application No. 62/564,257, filed on Sep. 27, 2017.

(51) Int. Cl.
*H01L 21/285* (2006.01)
*H01L 21/3065* (2006.01)
*H01L 21/311* (2006.01)

(58) Field of Classification Search
USPC .................................................. 438/706–722
See application file for complete search history.

(56) References Cited

U.S. PATENT DOCUMENTS

| | | |
|---|---|---|
| 9,269,563 B2 | 2/2016 | Ren et al. |
| 9,299,581 B2 | 3/2016 | Lee et al. |
| 9,478,434 B2 | 10/2016 | Wang et al. |
| 9,484,202 B1 | 11/2016 | Zhou et al. |
| 10,636,675 B2 * | 4/2020 | Mehrotra .......... H01L 21/32136 |
| 10,957,558 B2 * | 3/2021 | Mehrotra .......... H01L 21/28562 |
| 2003/0064602 A1 | 4/2003 | Stojakovic et al. |
| 2012/0196447 A1 | 8/2012 | Yang et al. |
| 2015/0024592 A1 | 1/2015 | Chandrashekar et al. |
| 2018/0025914 A1 | 1/2018 | Zhou et al. |
| 2019/0157399 A1 * | 5/2019 | Kosugi .............. H01L 29/1608 |
| 2020/0194272 A1 | 6/2020 | Jain et al. |

\* cited by examiner

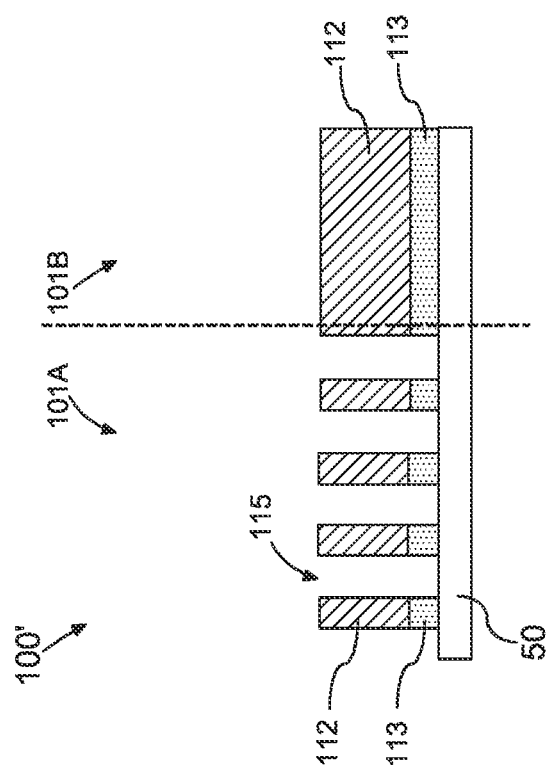
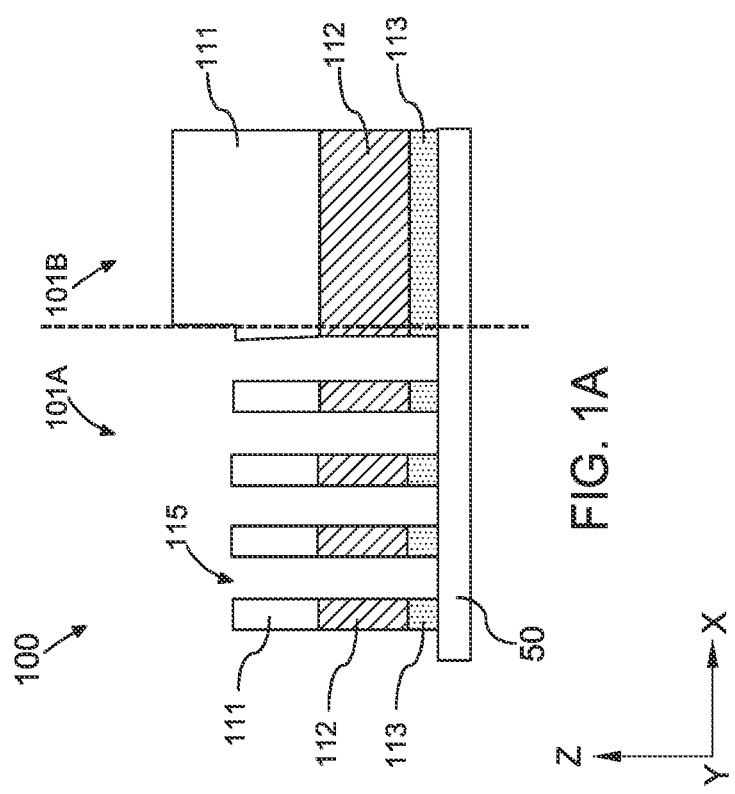

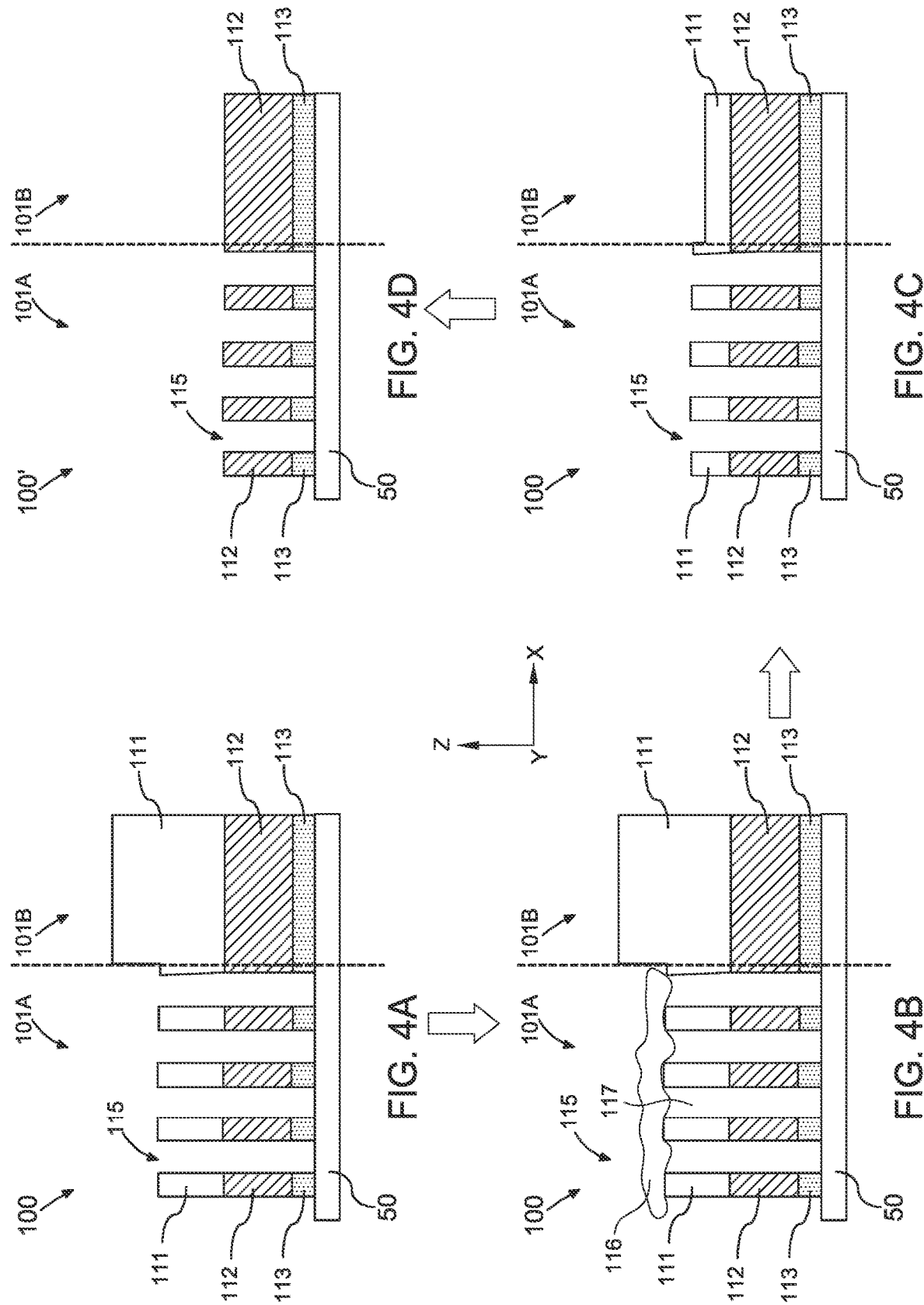

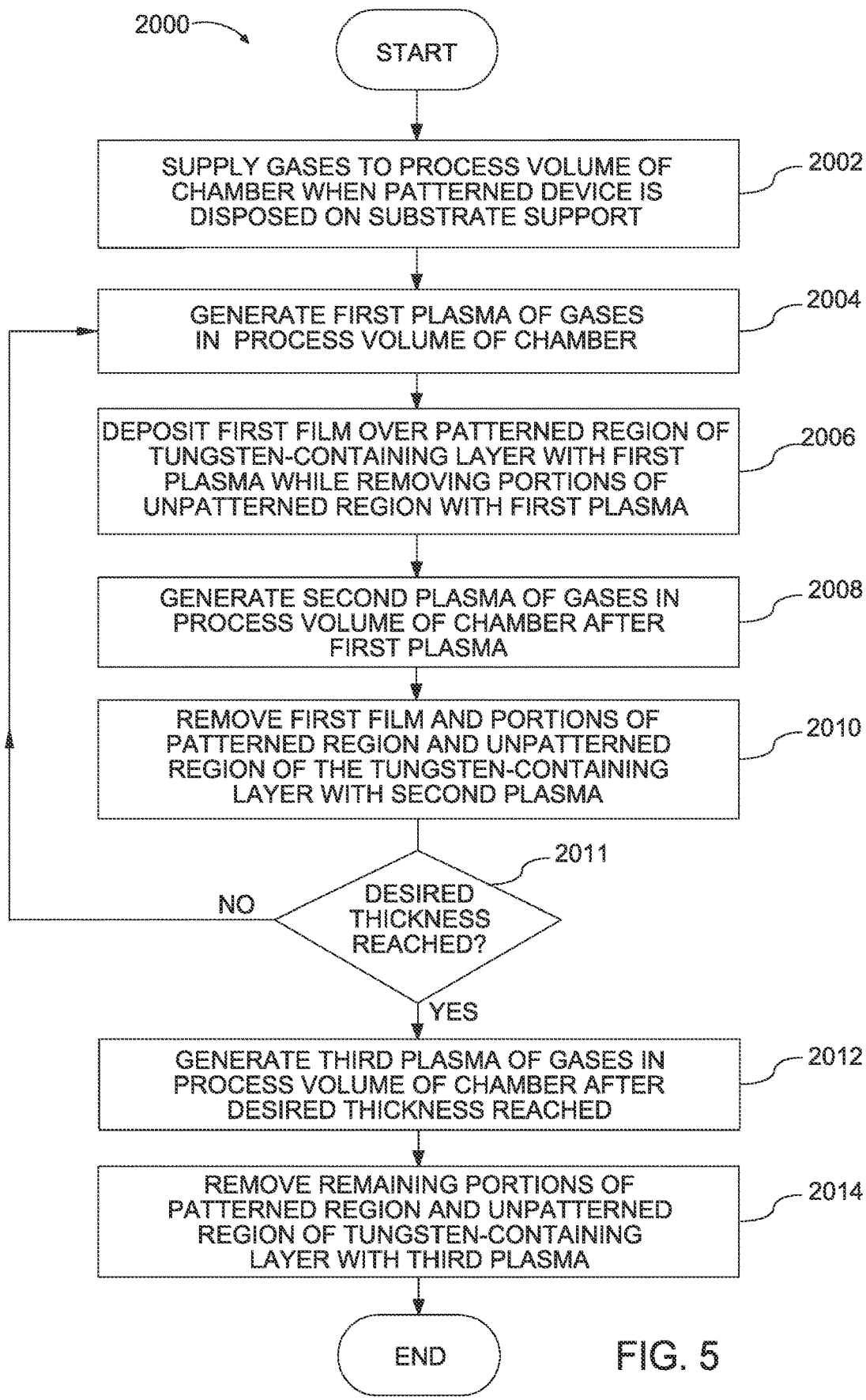

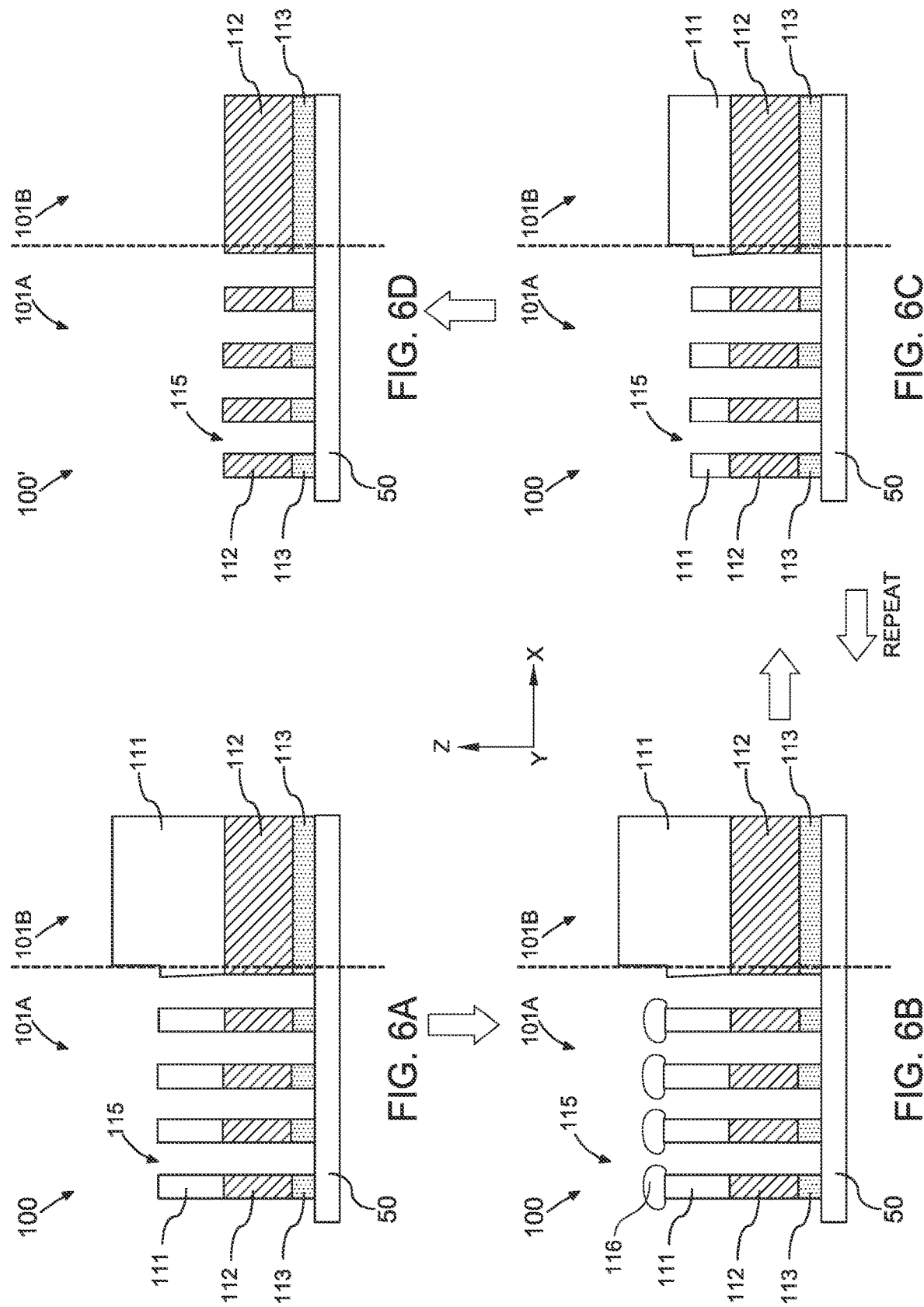

METHODS OF ETCHING METAL-CONTAINING LAYERS

CROSS-REFERENCE TO RELATED APPLICATIONS

This application is a continuation of U.S. patent application Ser. No. 16/828,751, filed Mar. 24, 2020, which is a continuation of U.S. patent application Ser. No. 16/141,777, filed Sep. 25, 2018, which claims benefit of U.S. provisional patent application Ser. No. 62/564,257, filed Sep. 27, 2017, and U.S. provisional patent application Ser. No. 62/597,163, filed Dec. 11, 2017, which are each hereby incorporated herein by reference.

BACKGROUND

Field

Embodiments of the present disclosure generally relate to methods for forming semiconductor device structures.

Description of the Related Art

Hard masks are used for etching deep, high aspect ratio (HAR) features that conventional photoresists cannot withstand. As chip features continue to shrink, innovations in hard masks are required to preserve the pattern integrity of tightly packed and/or tiny interconnect structures. These innovations include using harder materials for the hard masks, such as metal-containing layers including tungsten, titanium, or tantalum, such as tungsten carbide ($W_xC$), tungsten nitride ($W_xN$), tungsten silicide ($W_xSi$), tungsten boron carbide ($W_xB_yC$), tungsten oxide ($WO_x$), tungsten carbon nitride ($W_xC_yN$), titanium nitride, (TiN), titanium silicon nitride ($Ti_xSi_yN$), titanium oxide ($TiO_2$) Although metal-containing hard masks, such as tungsten-containing hard masks can improve the process of selectively etching features above the hard masks versus features below the hard mask, eventually portions or all of the hard masks need to be removed. Selective removal of metal-containing hard masks, such as tungsten-containing hard masks, has proved challenging, especially when there are substantial variations in the thickness of the tungsten-containing layer over different portions of the tungsten-containing layer.

Thus, there is a need for improved methods of selective removal of metal-containing layers, such as tungsten-containing layers.

SUMMARY

Embodiments of the present disclosure generally relate to methods for forming semiconductor device structures. In one embodiment, a method of removing a tungsten-containing layer from a substrate is provided. The method includes generating a first plasma in a process volume of a plasma chamber when a patterned device is disposed on a substrate support in the process volume. The patterned device includes a patterned region and an unpatterned region, a substrate, a tungsten-containing layer formed over the substrate, a supporting layer disposed between the tungsten-containing layer and the substrate. The patterned region includes exposed surfaces of the supporting layer and the unpatterned region does not include any exposed surfaces of the supporting layer. The method further includes depositing a first film over the patterned region of the tungsten-containing layer with the first plasma, and removing portions of the unpatterned region of the tungsten-containing layer with the first plasma without depositing the first film over the unpatterned region.

In another embodiment, a method of removing a tungsten-containing layer from a substrate is provided. The method includes generating a first plasma in a process volume of a plasma chamber, wherein a patterned device is disposed on a substrate support in the process volume. The patterned device includes a substrate; a tungsten-containing layer formed over the substrate, the tungsten-containing layer comprising a patterned region including changes in thickness of the tungsten-containing layer of at least 20% and an unpatterned region without any changes in thickness greater than 10%. The method further includes depositing a first film comprising tungsten over the patterned region of the tungsten-containing layer with the first plasma, and removing portions of the unpatterned region of the tungsten-containing layer with the first plasma without depositing the first film over the unpatterned region.

In another embodiment, a method of removing a tungsten-containing layer from a substrate is provided. The method includes generating a first plasma in a process volume of a plasma chamber, wherein a patterned device is disposed on a substrate support in the process volume. The patterned device includes a substrate, a tungsten-containing layer comprising tungsten and one or more of carbon and nitrogen formed over the substrate, the tungsten-containing layer comprising a patterned region including changes in thickness of the tungsten-containing layer of at least 20% and an unpatterned region without any changes in thickness greater than 10%; and a supporting layer comprising silicon nitride or silicon oxide disposed between the tungsten-containing layer. The method further includes depositing a first film comprising tungsten over the patterned region of the tungsten-containing layer with the first plasma; removing portions of the unpatterned region of the tungsten-containing layer with the first plasma without depositing the first film over the unpatterned region, generating a second plasma in the process volume of the plasma chamber after generating the first plasma, and removing the first film and portions of the patterned region and the unpatterned region of the tungsten-containing layer with the second plasma, wherein an RF bias is supplied to the substrate support at a first power level during the generation of the first plasma and the RF bias is supplied to the substrate support at a second power level during generation of the second plasma, wherein the first power level is lower than the second power level.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 1A is a partial cross-sectional view of a patterned device before being treated using one or more of the methods described in the Figures below.

FIG. 1B is a partial cross-sectional view of the patterned device of FIG. 1A after being treated using one or more of the methods described below in reference to FIGS. 3-6.

FIGS. 4A-4D illustrate different stages of removing the tungsten-containing layer from the patterned device of FIG. 4A to form the patterned device of FIG. 4D using the method 1000 of FIG. 3, according to one embodiment.

FIG. 5 is a process flow diagram of a method of forming the patterned device of FIG. 1B using the etching process chamber of FIG. 2, according to one embodiment.

FIGS. 6A-6D illustrate different stages of removing the tungsten-containing layer from the patterned device of FIG. 6A to form the patterned device of FIG. 6D using the method of FIG. 5, according to one embodiment.

Figure 2:
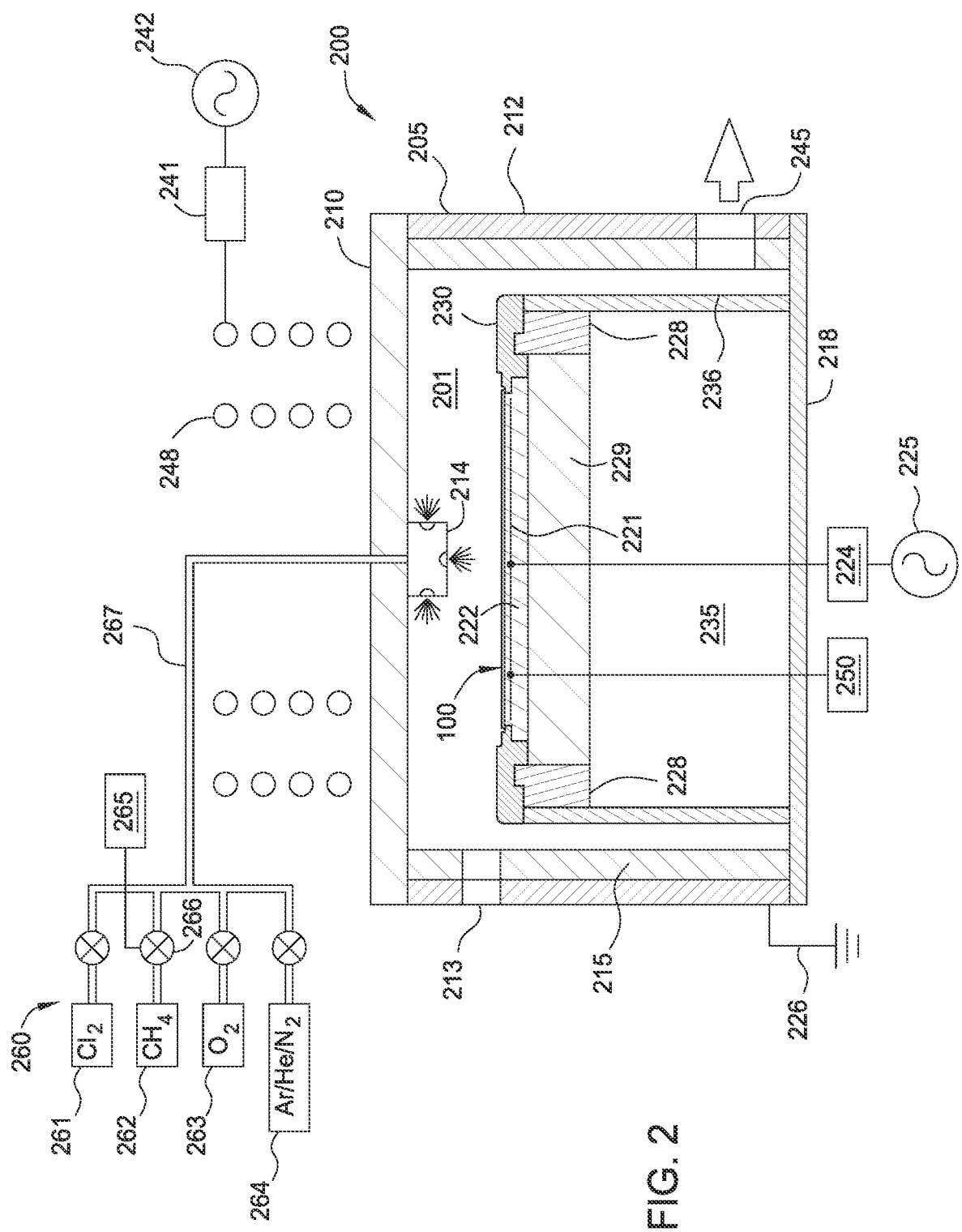
FIG. 2 is a simplified cutaway view for an exemplary etching process chamber for selectively removing a tungsten-containing layer from a patterned device, such as the tungsten-containing layer from the patterned device described above in reference to FIG. 1A.

To facilitate understanding, identical reference numerals have been used, where possible, to designate identical elements that are common to the figures. It is contemplated that elements disclosed in one embodiment may be beneficially utilized on other embodiments without specific recitation. The drawings referred to here should not be understood as being drawn to scale unless specifically noted. Also, the drawings are often simplified and details or components omitted for clarity of presentation and explanation. The drawings and discussion serve to explain principles discussed below, where like designations denote like elements.

DETAILED DESCRIPTION

Embodiments of the present disclosure generally relate to methods of selective removal of metal-containing layers (e.g., tungsten-containing hard masks) using dry etching. The methods described below can be used to selectively etch metal-containing layers, such as tungsten carbide ($W_xC$), titanium nitride (TiN), tungsten nitride ($W_xN$), tungsten silicide ($W_xSi$), tungsten Boron Carbide ($W_xB_yC$) and tungsten carbon nitride ($W_xC_yN$). For example, the methods described below can be used to remove tungsten-containing layers from patterned structures without damaging the underlying layers even when there are substantial differences in thickness of the tungsten-containing layer over different portions of the patterned structure. Furthermore, the methods described below can selectively etch tungsten-containing layers (e.g., WC) relative to silicon oxide at a ratio of greater than 300:1 and can selectively etch tungsten-containing layers (e.g., WC) relative to silicon nitride at a ratio of greater than 1000:1. Although the following disclosure generally describes methods of selective removal of tungsten-containing hard masks, the disclosure is equally applicable to selective removal of any layer formed of a carbide, oxide, or nitride, such as a carbide, oxide, or nitride including one or more metals, such as a carbide, oxide, or nitride layer including one or more of tungsten, tantalum, titanium (e.g., TiN), cobalt, strontium (such as $SrTiO_x$), hafnium, in a semiconductor process.

FIG. 1A is a partial cross-sectional view of a patterned device 100 before being treated using one or more of the methods described below. FIG. 1B is a partial cross-sectional view of the patterned device 100' after being treated using one or more of the methods described below in reference to FIGS. 3-6. Notably, in FIG. 1B, while all of the tungsten-containing layer 111 of FIG. 1A has been removed, none or only a negligible amount of the underlying layer 112 has been removed. Before being treated, patterned device 100 includes a tungsten-containing layer 111 that has substantial variations in thickness over different portions of the tungsten-containing layer 111. These thickness variations present challenges in removing the tungsten-containing layer without damaging the underlying layer(s). For example, if conventional etching processes were applied to remove the tungsten-containing layer 111 shown in FIG. 1A, then portions of the layer 112 underlying thinner portions of the tungsten-containing layer 111 would be damaged (e.g., partially removed) in the process. The methods described below overcome these challenges by using methods that can selectively etch the thicker portions of the tungsten-containing layer 111 at faster overall rates than the thinner portions of the tungsten-containing layer 111. For example, the methods described below can include operations which etch the thicker portions while simultaneously depositing and protecting a film over the thinner portions.

Referring to FIG. 1A, the patterned device 100 includes a substrate 50, the tungsten-containing layer 111, and a supporting layer 112. The supporting layer 112 is formed over the substrate 50, and the tungsten-containing layer 111 is formed on the supporting layer 112. In some embodiments, the tungsten-containing layer 111 can be a hard mask layer. The tungsten-containing layer 111 can be formed of tungsten carbide (WC), tungsten carbon nitride (WCN), tungsten nitride (WN), tungsten silicide (WSi), tungsten boride (WB), or other layer including tungsten. In some embodiments, the tungsten composition in the tungsten-containing layer 111 can be greater than 15%, such as greater than 60%, or greater than 80%. In some embodiments, the supporting layer 112 is formed of a dielectric material, such as silicon nitride or silicon oxide. For example, in some embodiments the supporting layer 112 can be used as a part of capping layer for a conductive structure, such as an interconnect that can be subsequently formed by, for example partially filling the holes or trenches 115 with a conductive material.

In some embodiments, an intermediate layer 113 is formed between the supporting layer 112 and the substrate 50. The intermediate layer 113 can include one or more individual layers (not shown), such as one or more conductive and/or insulating layers.

The patterned device 100 includes a plurality of trenches 15 formed over the substrate 50. Although the patterned device 100 is shown including the plurality of trenches 15, in other embodiments the patterned device 100 can include other patterned features, such as other high aspect ratio structures, for example, holes, line/space, vias or dual damascene structures. In some embodiments, the high aspect ratio features have an aspect ratio greater than 1:1, such as greater than 2:1, such as greater than 50:1. The patterned device 100 includes a patterned region 101A that includes the plurality of trenches 15. The patterned device 100 further includes an unpatterned region 101B that does not include patterned features, such as the plurality of trenches 15. The patterned region 101A includes exposed surfaces of one or more underlying layers, such as the supporting layer 112. The unpatterned region 101B does not include any exposed surfaces of any underlying layers, such as the supporting layer 112. Furthermore, the patterned region 101A can include changes in thickness in the direction in which the layers are stacked (i.e., the Z-direction) of the tungsten-containing layer 111 of at least 20% across the patterned region 101A (i.e., the XY plane) while the unpatterned region 101B does not include any changes in thickness of the tungsten-containing layer 111 in the Z-direction across the XY plane greater than 10%. For example, the thickness of the tungsten-containing layer 111 across the XY plane in the patterned region 101A is a first thickness above the supporting layer 112 and is reduced to zero in the trenches 115, which is a change in thickness greater than 20%. Moreover, the tungsten-containing layer 111 in the unpatterned region 101B can be substantially flat in some embodiments, which is a change in thickness less than 10%. In other embodiments, the patterned region 101A can be defined by changes in elevation of the outer surface (i.e., top surface) of the tungsten-containing layer 111 in the Z-direction, which are greater than 20% of the thickness of the tungsten-containing layer 111 in the Z-direction while the unpatterned region 101B does not include any changes in elevation in the Z-direction of the tungsten-containing layer 111 greater than 10%.

Referring to FIG. 1A, the tungsten-containing layer 111 is substantially thicker in the unpatterned region 101B than in the patterned region 101A due to previous processing. For example, the processing to form the trenches 115 is focused in the patterned region 101A and results in a partial removal of the portions of the tungsten-containing layer 111 over the supporting layer 112 in the patterned region 101A while this same processing leaves the tungsten-containing layer 111 in the unpatterned region 101B largely unaffected resulting in the substantial thickness difference of the tungsten-containing layer 111 between the patterned region 101A and the unpatterned region 101B. The methods described below overcome these challenges presented by this thickness difference by using methods that can etch the thicker portions of the tungsten-containing layer 111 in the unpatterned region 101B at faster overall rates than the thinner portions of the tungsten-containing layer 111 in the patterned region 101A. As described below, the methods can include operations which etch the thicker portions of the tungsten-containing layer 111 in the unpatterned region 101B while simultaneously depositing a film over the thinner portions of the tungsten-containing layer 111 in the patterned region 101A.

FIG. 2 is a simplified cutaway view for an exemplary etching process chamber 200 for selectively removing a tungsten-containing layer from a patterned device, such as the tungsten-containing layer 111 from the patterned device 100 described above in reference to FIG. 1A. One example of the process chamber that may be adapted to benefit from the disclosure is an AdvantEdge Mesa Etch or Sym3 Etch processing chamber, available from Applied Materials, Inc., located in Santa Clara, Calif. It is contemplated that other process chambers, including those from other manufactures, may be adapted to practice embodiments of the disclosure.

The etching process chamber 200 includes a chamber body 205 having a process volume 201 defined therein. The chamber body 205 has sidewalls 212 and a bottom 218 which are coupled to an electrical ground 226. The sidewalls 212 have a protective inner liner 215 to extend the time between maintenance cycles of the etching process chamber 200. The dimensions of the chamber body 205 and related components of the etching process chamber 200 are not limited and generally are proportionally larger than the size of the patterned device 100 to be processed therein.

The chamber body 205 supports a chamber lid assembly 210 to enclose the process volume 201. The chamber body 205 may be fabricated from aluminum or other suitable materials. An access port 213 is formed through the sidewalls 212 of the chamber body 205, facilitating the transfer of the patterned device 100 into and out of the etching process chamber 200.

A pumping port 245 is formed through one or more of the sidewalls 212 of the chamber body 205 and is connected to the process volume 201. A pumping device (not shown) is coupled through the pumping port 245 to the process volume 201 to evacuate and control the pressure therein. The pressure may be controlled during processing between about 1 mTorr to about 200 mTorr, such as from about 5 mTorr to about 50 mTorr, such as about 10 mTorr. The temperature of the process volume 201 can be maintained between about 0° C. to about 180° C., such as from about 25° C. to about 120° C.

A gas panel 260 is coupled by a gas line 267 to the chamber body 205 to supply gases into the process volume 201. The gas panel 260 may include one or more process gas sources 261, 262, 263 and may additionally include a dilution gas source 264. Examples of process gases that may be provided by the gas panel 260 include, but are not limited to a halogen-containing gas (e.g., $Cl_2$ HBr, $BCl_3$, $Br_2$,), a hydrogen-containing gas (e.g., $CH_3F$, $CH_2F_2$, $CHF_3$, HBr, $CH_4$, $H_2$), and an oxygen-containing gas (e.g., $O_2$, COS, $SO_2$). In one example, the process volume 201 of the process chamber 200 into which the process gases flow is between 90,000 cc and 160,000 cc, such as about 125,000 cc.

Valves 266 control the flow of the process gases from the gas sources 261, 262, 263, 264 from the gas panel 260 and are managed by a controller 265. The flow of the gases supplied to the process volume 201 from the gas panel 260 may include combinations of the gases.

The chamber lid assembly 210 may include a nozzle 214. The nozzle 214 has one or more ports for introducing the process gases and inert gases from the gas sources 261, 262, 263, 264 of the gas panel 260 into the process volume 201. After the process gases are introduced into the etching process chamber 200, the gases are energized to form plasma. An antenna 248, such as one or more inductor coils, may be provided adjacent to the etching process chamber 200. An antenna power supply 242 applies power to the antenna 248 through a match circuit 241 to inductively couple energy, such as RF energy, to the process gas to maintain a plasma formed from the process gas in the process volume 201 of the etching process chamber 200. The operation of the antenna power supply 242 may be controlled by a controller, such as the controller 265, that also controls the operation of other components in the etching process chamber 200.

A substrate support pedestal 235 is disposed in the process chamber 200 to support the patterned device 100 during processing. The substrate support pedestal 235 may include an electro-static chuck 222 for holding the patterned device 100 during processing. The electro-static chuck (ESC) 222 uses electro-static attraction to hold the substrate 50 of the patterned device 100 to the substrate support pedestal 235. The ESC 222 includes an electrode 221 powered by a power source 250. The electrode 221 is embedded in the ESC 222 within a dielectric body. The power source 250 may also include a system controller for controlling the operation of the electrode 221 by directing a DC current to the electrode 221 for chucking and de-chucking the patterned device 100.

Furthermore, the electrode 221 may further be coupled to an RF power supply 225 integrated with a match circuit 224. The RF power supply 225 provides a bias to the electrode 221 which attracts plasma ions, formed by the process gases in the process volume 201, to the ESC 222 and patterned device 100 positioned thereon. The ESC 222 has an isolator 228 for the purpose of making the sidewall of the ESC 222 less attractive to the plasma to prolong the maintenance life cycle of the ESC 222. Additionally, the substrate support pedestal 235 may have a cathode liner 236 to protect the sidewalls of the substrate support pedestal 235 from the plasma gases and to extend the time between maintenance of the etching process chamber 200.

The ESC 222 may include heaters (not shown) disposed therein and connected to a power source (not shown), for heating the patterned device 100, while a heat transfer base 229 supporting the ESC 222 may include conduits for circulating a heat transfer fluid to maintain a temperature of the ESC 222 and patterned device 100 disposed thereon. The ESC 222 is configured to perform in the temperature range required by the thermal budget of the device being fabricated on the patterned device 100. For example, the ESC 222 may be configured to maintain the patterned device 100 at a temperature of about minus about 0 degrees Celsius to about 200 degrees Celsius for certain embodiments.

A cover ring 230 is disposed on the ESC 222 and along the periphery of the substrate support pedestal 235. The cover ring 230 is configured to confine etching gases to a desired portion of the exposed top surface of the patterned device 100, while shielding the top surface of the substrate support pedestal 235 from the plasma environment inside the etching process chamber 200. Lift pins (not shown) are selectively moved through the substrate support pedestal 235 to lift the patterned device 100 above the substrate support pedestal 235 to facilitate access to the patterned device 100 by a transfer robot (not shown) or other suitable transfer mechanism.

The controller 265 may be utilized to control the process sequence, regulating the gas flows from the gas panel 260 into the etching process chamber 200 and other process parameters, such as the frequencies and power provided to the electrode 221 and the antennas 248. Software routines, when executed by a CPU of the controller 265, transform the CPU into a specific purpose computer (controller) that controls the etching process chamber 200 such that the processes are performed. The software routines may also be stored and/or executed by a second controller (not shown).

Figure 3:
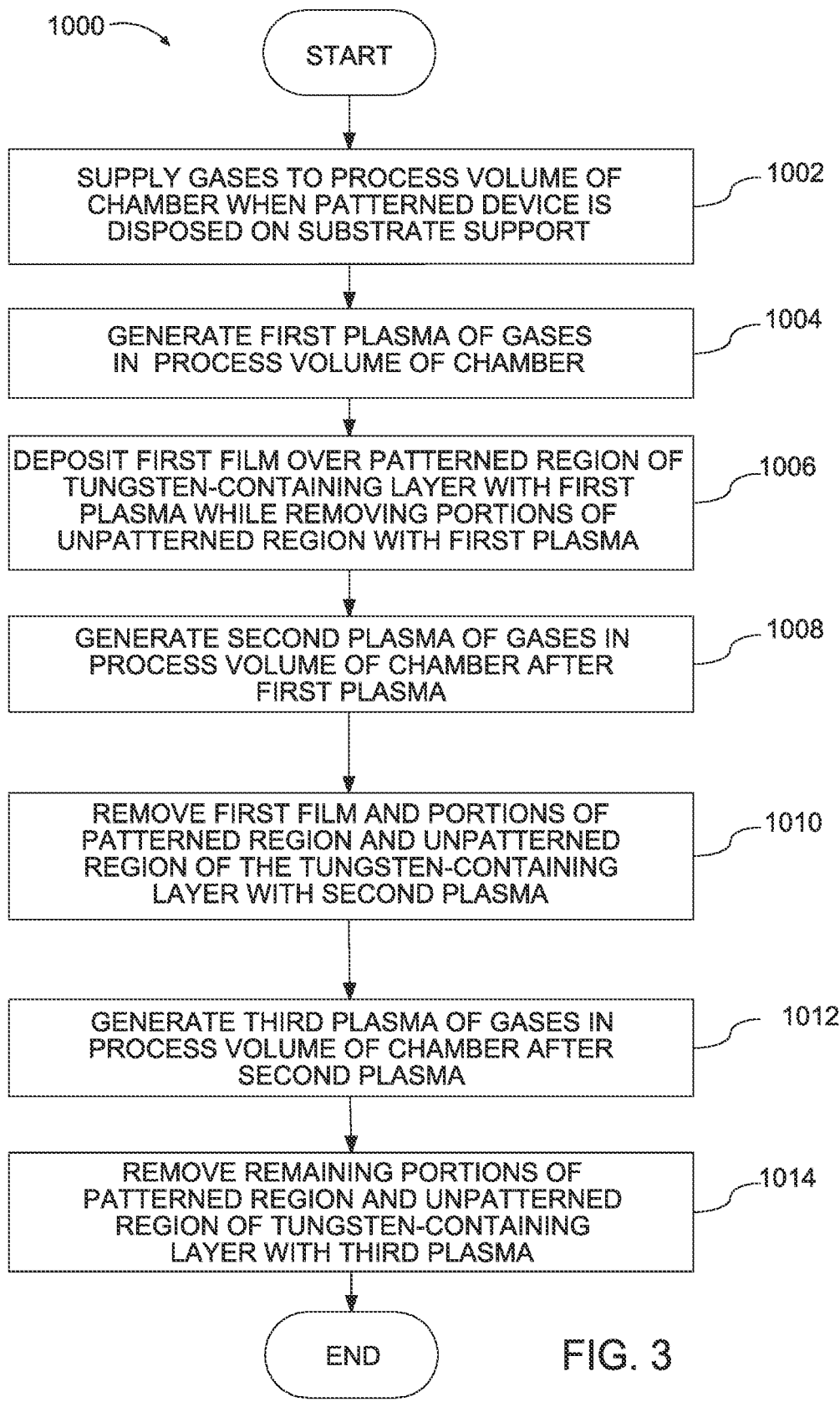
FIG. 3 is a process flow diagram of a method of forming the patterned device of FIG. 1B using the etching process chamber of FIG. 2, according to one embodiment.

FIG. 3 is a process flow diagram of a method 1000 of forming the patterned device 100' of FIG. 1B using the etching process chamber 200 of FIG. 2, according to one embodiment. FIGS. 4A-4D illustrate different stages of removing the tungsten-containing layer 111 from the patterned device 100 of FIG. 4A to form the patterned device 100' of FIG. 4D using the method 1000 of FIG. 3, according to one embodiment. FIGS. 4A and 4D are the same as FIGS. 1A and 1B described above. Referring to FIGS. 2, 3 and 4A-4D, the method 1000 is described.

At block 1002, process gases and an optional dilution gas (e.g., Ar, He, $N_2$) are supplied to the process volume 201 of the process chamber 200. In one embodiment, a first gas comprising oxygen (e.g., $O_2$, COS, $SO_2$), a second gas comprising halogen-containing gases such as chlorine-containing gas (e.g., $BCl_3$, $Cl_2$) or a bromine-containing gas (e.g., HBr, $Br_2$) are provided to the process volume 201 of the process chamber 200. In another embodiment, the first gas comprising oxygen, the second gas comprising chlorine, and a third gas comprising hydrogen (e.g., $CH_4$, $H_2$) are provided to the process volume 201 of the process chamber 200. The chlorine-containing gas can be provided to the process volume 201 at a flowrate from about 0 to about 2000 sccm, such as from about 50 sccm to about 1000 sccm. The oxygen-containing gas can be provided to the process volume 201 at a flowrate from about 0 to about 1000 sccm, such as from about 10 sccm to about 200 sccm. The hydrogen-containing gas can be provided to the process volume 201 at a flowrate from about 0 to about 250 sccm, such as from about 5 sccm to about 100 sccm. The dilution gas can be provided to the process volume 201 at a flowrate from about 0 to about 1000 sccm, such as from about 100 sccm to about 500 sccm.

At block 1004, a first plasma of the gases provided to the process volume 201 of the process chamber 200 is generated. The first plasma can be generated by energizing the antenna 248 with energy, such as RF energy. The antenna power supply 242 can supply RF energy at frequencies from about 0.1 MHz to about 200 MHz, such as from about 0.3 MHz to about 40 MHz, or even from about 0.3 MHz to about 13.56 MHz, such as about 2 MHz at power levels from about 250 W to about 9000 W, such as from about 500 W to about 4500 W, such as about 2000 W. The RF energy supplied to the antenna 248 can be pulsed at a duty cycle from about 10% or higher, and in some embodiments continuous wave RF energy is applied to the antennas 248. In some embodiments, the duty cycle of the pulse is from about 25% to about 95%. However, in other embodiments continuous wave RF energy can be applied to the antennas 248.

Additionally, at block 1004, a bias signal can be applied to the electrode 221 of the electrostatic chuck 222. The bias signal from the electrode 221 can be used to fine tune the plasma and control whether the plasma results in etching portions of the tungsten-containing layer 111 and/or depositing additional material over portions of the tungsten-containing layer 111. The RF power supply 225 may provide RF power to the electrode 221 at a power level from about 25 W to about 1000 W, such as from about 75 W to about 500 W. The RF power supply 225 can supply RF energy at frequencies from about 0.1 MHz to about 200 MHz, such as from about 0.2 MHz to about 60 MHz, or even from about 0.2 MHz to about 13.56 MHz, such as about 2 MHz. The RF power supply 225 provides a bias to the electrode 221 which attracts plasma ions, formed by the process gases in the process volume 201, to the ESC 222 and patterned device 100 positioned thereon. The RF power supply 225 may cycle on and off, or pulse, during processing of the patterned device 100.

For example, in one embodiment, the RF energy supplied by RF power supply 225 can be pulsed at a duty cycle from about 10% to about 98%, such as from about 25% to about 95%. In another embodiment, continuous wave RF energy is provided by the RF power supply 225. In some embodiments, the duty cycle can be in synchronous pulsing for the source (i.e., the antenna power supply 242) and the bias (i.e., the RF power supply 225). In other embodiments, advanced pulsing methods such as a delay between pulsing of the source and the bias can be used. In such embodiments, the source can pulse at a different or same duty cycle as the bias, and the bias pulse can be applied with a delay relative to the source. In some embodiments, when the source duty cycle is in the ON phase, the bias duty cycle is in the OFF phase, and when bias duty cycle is in the ON phase, the source duty cycle is in the OFF phase.

Referring to FIGS. 3 and 4B, at block 1006, a first film 116 is deposited over the patterned region 101A of the tungsten-containing layer 111 with the first plasma. The first film 116 can include tungsten (e.g., tungsten oxide). In some embodiments, the first film 116 can have a thickness from about 30 nm to about 200 nm, such as about 100 nm. In some embodiments, the first film 116 can completely cover the trenches 115 creating voids 117. The voids 117 can be beneficial when the etch rate of a plasma for the supporting layer 112 is higher than desired. For example, once the voids 117 are formed a plasma that is aggressive towards etching the tungsten-containing layer 111 in the unpatterned region can be applied with less concern for etching the supporting layer 112 while the voids 117 are still covered and thus protected by the first film 116. Thus, in some embodiments the first plasma can be modified (e.g., modifying flowrates of gases and/or electrical characteristics of energy provided to antenna 248 and/or to the electrode 221) once the voids 117 are formed to take advantage of the protection of the supporting layer 112 provided by the first film 116. In some embodiments, tungsten oxide is the only nonvolatile byproduct generated from exposing the tungsten-containing layer 111 to the first plasma. Volatile byproducts can include carbon monoxide as well as gases including chlorine and one or more compounds of tungsten and oxygen.

Also at block 1006, portions of the tungsten-containing layer 111 in the unpatterned region 101B are removed with the first plasma. At the completion of block 1006, the thickness of the tungsten-containing layer 111 in the unpatterned region 101B is substantially reduced while the thickness of the tungsten-containing layer 111 in the patterned region 101A is not reduced as shown in FIG. 4B. Thus, a difference of the thickness of the tungsten-containing layer 111 between the patterned region 101A and the unpatterned region 101B is substantially reduced by execution of block 1006. In some embodiments, at block 1006, the thickness of the tungsten-containing layer 111 in the patterned region 101A is reduced, but by a substantially smaller amount than the thickness of the tungsten-containing layer 111 of the unpatterned region 101B. For example, the thickness reduction of the tungsten-containing layer 111 in the unpatterned region 101B can be at least two times greater than the thickness reduction of the tungsten-containing layer 111 found in the patterned region 101A, such as at least ten times greater. Thus, the etching process at block 1006 is highly selective between the unpatterned region 101B (etching) and the patterned area 110A (deposition). Notably, the first film 116 is not deposited over the unpatterned region 101B of the tungsten-containing layer 111.

At block 1008, a second plasma of the gases provided to the process volume 201 of the process chamber 200 is generated after generating the first plasma. The second plasma can be generated by energizing the antenna 248 with energy, such as RF energy. Additionally, at block 1008, a bias signal can be applied to the electrode 221 of the electrostatic chuck 222. The bias signal from the electrode 221 can be used to fine tune the plasma and control whether the plasma results in etching portions of the tungsten-containing layer 111 and/or depositing additional material over portions of the tungsten-containing layer 111. The second plasma is generated using different gases (e.g., different flowrates or different gas sources) and/or different electrical characteristics (e.g., power level, frequency, continuous wave, pulse, duty cycle of pulse) of the power provided to the antenna 248 and/or the electrode 221.

Referring to FIGS. 3 and 4C, at block 1010, the first film 116 is removed with the second plasma. Furthermore, at block 1010 portions of the patterned region 101A and the unpatterned region 101B of the tungsten-containing layer 111 are removed with the second plasma. At the completion of block 1010, a difference in thickness between the patterned region 101A and the unpatterned region 101B of the tungsten-containing layer 111 is substantially reduced relative to the initial difference in thickness between the patterned region 101A and the unpatterned region 101B of the tungsten-containing layer 111 at the start of method 1000.

As mentioned above, the gases provided to the process volume 201 of the process chamber 200 for the second plasma can be different gases or different flowrates of gases relative to the gases and flowrates provided to the process volume 201 of the process chamber 200 for the first plasma. For example, in one embodiment of method 1000, an addition of 5 sccm of methane during the second plasma can be sufficient to stop deposition of the first film 116 over the patterned region 101A of the tungsten-containing layer 111 and instead cause removal of the first film 116 as well as causing the removal of portions of the patterned region 101A and the unpatterned region 101B of the tungsten-containing layer 111 relative to a first plasma not including any methane. The differences in the process conditions between the first plasma and the second plasma for this example are shown below in Table 1. In another embodiment, an optional second plasma can be formed by decreasing the flowrate of oxygen to 15 sccm from the 25 sccm in the first plasma while all other flowrates and other conditions can remain the same as those shown below for the first plasma in Table 1. This decrease in the flowrate of oxygen without any addition of methane is also sufficient to stop deposition of the first film 116 over the patterned region 101A of the tungsten-containing layer 111 and instead cause removal of the first film 116 as well as causing the removal of portions of the patterned region 101A and the unpatterned region 101B of the tungsten-containing layer 111.

In yet another embodiment, the transition between the first plasma and the second plasma can be accomplished by changing the bias power applied to the electrode 221 while keeping other process conditions constant. For example, an alternate first plasma can be generated by supplying oxygen, chlorine, and methane to the process volume with a bias power of 125 W, and an alternate second plasma can be generated by supplying the same gases at the same flowrates but at a bias power or 150 W as shown below in Table 1.

TABLE 1

|  | Pressure mTorr | Power (W) to Antenna 248 | Bias Power (W) to electrode 221 | Bias Duty Cycle | $O_2$ sccm | $Cl_2$ sccm | $CH_4$ sccm |
| --- | --- | --- | --- | --- | --- | --- | --- |
| First Plasma | 10 | 2000 | 175 | 75% | 25 | 200 | 0 |
| Second Plasma | 10 | 2000 | 175 | 75% | 25 | 200 | 5 |
| Optional Second Plasma | 10 | 2000 | 175 | 75% | 15 | 200 | 0 |
| Alternate First Plasma | 10 | 2000 | 125 | 75% | 25 | 200 | 5 |
| Alternate Second Plasma | 10 | 2000 | 150 | 75% | 25 | 200 | 5 |

Furthermore, as mentioned above the electrical characteristics for the power provided to the antenna 248 and/or for the power provided to the electrode 221 may be different at block 1008 for generating the second plasma relative to block 1004 for generating the first plasma. For example, in one embodiment of method 1000, an increase in the bias power provided to the electrode 221 from about 125 W to about 150 W can be sufficient to stop deposition of the first film 116 over the patterned region 101A of the tungsten-containing layer 111 and instead cause removal of the first film 116 as well as causing the removal of portions of the patterned region 101A and the unpatterned region 101B of the tungsten-containing layer 111. The differences in the process conditions between the first plasma and the second plasma for this example are shown below in Table 2.

TABLE 2

| | Pressure mTorr | Power (W) to Antenna 248 | Bias Power (W) to electrode 221 | Bias Duty Cycle | $O_2$ sccm | $Cl_2$ sccm | $CH_4$ sccm |
|---|---|---|---|---|---|---|---|
| First Plasma | 10 | 2000 | 125 | 75% | 25 | 200 | 5 |
| Second Plasma | 10 | 2000 | 150 | 75% | 25 | 200 | 5 |

At block 1012, a third plasma of the gases provided to the process volume 201 of the process chamber 200 is generated after generating the second plasma. In some embodiments, the gases provided to the process volume 201 of the process chamber 200 for the third plasma are different gases or different flowrates of gases relative to the gases and flowrates provided to the process volume 201 of the process chamber 200 for the first plasma and second plasma. Furthermore, the electrical characteristics for the power provided to the antenna 248 and/or for the power provided to the electrode 221 may be different at block 1012 for generating the third plasma relative to block 1004 for generating the first plasma and relative to block 1008 for generating the second plasma. In one example, the process conditions for the third plasma are shown below in Table 3. In this example, the gases provided to the process volume 201 of the process chamber 200 include a gas composition that includes an oxygen containing gas (e.g., $O_2$) and a halogen containing gas (e.g., molecular chlorine ($Cl_2$)), and no hydrogen or carbon containing gases (e.g., $CH_4$, H Br).

TABLE 3

| | Pressure mTorr | Power (W) to Antenna 248 | Bias Power of 2 MHz(W) to electrode 221 | Bias Duty Cycle | $O_2$ sccm | $Cl_2$ sccm | $CH_4$ sccm |
|---|---|---|---|---|---|---|---|
| Third Plasma | 10 | 2000 | 100 | 75% | 30 | 200 | 0 |

Referring to FIGS. 3 and 4D, at block 1014, remaining portions of the patterned region 101A and the unpatterned region 101B of the tungsten-containing layer 111 are removed with the third plasma to expose a top surface of the supporting layer 112 (i.e., the surface previously covered by the tungsten-containing layer 111). Because the remaining portions of the tungsten-containing layer 111 can be removed with the third plasma, the third plasma can be highly selective to removing the tungsten-containing layer 111 relative to the underlying supporting layer 112, such as being more selective than the first plasma or the second plasma described above. In one embodiment, a highly selective etching process for removing the tungsten-containing layer 111 relative to the underlying supporting layer 112 (e.g., silicon nitride or silicon oxide) at ratios greater than 300:1 can be achieved by a process that includes applying RF power to the electrode 221 at a frequency from about 0.2 MHz to about 5 MHz, such as about 2 MHz at a bias power level from about 75 W to about 125 W, such as at about 100 W. In some embodiments, a pulsed (e.g., a duty cycle of 75%) or continuous wave RF energy can be applied to the antennas 248 at block 1014. At the completion of block 1014, the tungsten-containing layer 111 can be fully removed to form the patterned device 100' without removing and/or damaging any underlying layers, such as supporting layer 112. In some embodiments, a negligible amount of an underlying layer, such as the supporting layer 112, is removed in one or more of the patterned region 101A and/or the unpatterned region 101B. For example, a thickness of the supporting layer 112 after generation of the third plasma within 0.5% of the thickness of the supporting layer 112 before generation of the first plasma is considered a negligible amount. The process conditions for the third plasma can be selected to selectively remove the tungsten-containing layer 111 (e.g., WC) relative to the supporting layer 112 (e.g., silicon oxide) at ratio is greater than 100:1, such as greater than 300:1, such as even greater than 1000:1.

FIG. 5 is a process flow diagram of a method 2000 of forming the patterned device 100' of FIG. 1B using the etching process chamber 200 of FIG. 2, according to one embodiment. FIGS. 6A-6D illustrate different stages of removing the tungsten-containing layer 111 from the patterned device 100 of FIG. 6A to form the patterned device 100' of FIG. 6D using the method 2000 of FIG. 5, according to one embodiment. FIGS. 6A and 6D are the same as FIGS. 1A and 1B described above. Referring to FIGS. 2, 5 and 6A-6D, the method 2000 is described.

At block 2002, process gases and an optional dilution gas (e.g., Ar, He, $N_2$) are supplied to the process volume 201 of the process chamber 200. In one embodiment, a first gas comprising oxygen (e.g., $O_2$, COS, $SO_2$), a second gas comprising chlorine (e.g., $Cl_2$) are provided to the process volume 201 of the process chamber 200. In another embodiment, the first gas comprising oxygen, the second gas comprising chlorine, and a third gas comprising hydrogen (e.g., $CH_4$, $H_2$) are provided to the process volume 201 of the process chamber 200. The gases provided and the flowrates for the gases at block 2002 can be the same as described above for block 1002 of FIG. 3 or the same as those shown above in Tables 1 and 2 for the first plasma.

At block 2004, a first plasma of the gases provided to the process volume 201 of the process chamber 200 is generated. The first plasma can be generated by energizing the antenna 248 with energy, such as RF energy. The antenna power supply 242 can supply RF energy to the antenna 248 with the same electrical characteristics described above for block 1004 of FIG. 3 or shown above in Tables 1 and 2 for the first plasma.

Additionally, at block 2004, a bias signal can be applied to the electrode 221 of the electrostatic chuck 222. The bias signal from the electrode 221 can be used to fine tune the plasma and control whether the plasma results in etching portions of the tungsten-containing layer 111 and/or depositing additional material over portions of the tungsten-containing layer 111. The RF power supply 225 may provide RF power to the electrode 221 with the same electrical characteristics described above for block 1004 of FIG. 3 or shown above in Tables 1 and 2 for the first plasma.

Referring to FIGS. 5 and 6B, at block 2006, the first film 116 is deposited over the patterned region 101A of the tungsten-containing layer 111 with the first plasma. The first film 116 can include tungsten (e.g., tungsten oxide). In some embodiments, tungsten oxide is the only nonvolatile byproduct generated from exposing the tungsten-containing layer 111 to the first plasma. Volatile byproducts can include carbon monoxide as well as gases including chlorine and one or more of tungsten and an oxygen. Also at block 1006, portions of the tungsten-containing layer 111 in the unpatterned region 101B are removed with the first plasma.

At the completion of block 2006, the first film 116 does not completely cover the trenches 115 in block 2006, and thus the voids 117 described above in reference to block 1006 are not formed in block 2006. Also, less material is removed from the tungsten-containing layer 111 in the unpatterned region 101B in block 2006 relative to block 1006. In some embodiments, the reduced deposition of the first film and the reduced removal of the tungsten-containing layer 111 in the unpatterned region 101B in block 2006 relative to block 1006 is due to a shorter duration of block 2006 relative to block 1006.

Also at the completion of block 2006, the thickness of the tungsten-containing layer 111 in the unpatterned region 101B is substantially reduced while the thickness of the tungsten-containing layer 111 in the patterned region 101A is not reduced as shown in FIG. 4B. Thus, a difference of the thickness of the tungsten-containing layer 111 between the patterned region 101A and the unpatterned region 101B is substantially reduced by execution of block 2006. In some embodiments, at block 2006, the thickness of the tungsten-containing layer 111 in the patterned region 101A is reduced, but by a substantially smaller amount than the thickness of the tungsten-containing layer 111 of the unpatterned region 101B. Notably, the first film 116 is not deposited over the unpatterned region 101B of the tungsten-containing layer 111.

At block 2008, a second plasma of the gases provided to the process volume 201 of the process chamber 200 is generated after generating the first plasma. The second plasma can be generated by energizing the antenna 248 with energy, such as RF energy. Additionally, at block 2008, a bias signal can be applied to the electrode 221 of the electrostatic chuck 222. The bias signal from the electrode 221 can be used to fine tune the plasma and control whether the plasma results in etching portions of the tungsten-containing layer 111 and/or depositing additional material over portions of the tungsten-containing layer 111. The second plasma is generated using different gases (e.g., different flowrates or different gas sources) and/or different electrical characteristics (e.g., power level, frequency, continuous wave, pulse, duty cycle of pulse) of the power provided to the antenna 248 and/or the electrode 221. The second plasma generated in block 2008 can be generated using the same process conditions as those described above for the second plasma generated in block 1008 of FIG. 3. Exemplary process conditions to form the second plasma can also be found above in Tables 1 and 2 for the second plasma.

Referring to FIGS. 5 and 6C, at block 2010, the first film 116 is removed with the second plasma. Furthermore, at block 2010 portions of the patterned region 101A and the unpatterned region 101B of the tungsten-containing layer 111 are removed with the second plasma. At the completion of block 2010, a difference in thickness between the patterned region 101A and the unpatterned region 101B of the tungsten-containing layer 111 is substantially reduced relative to the initial difference in thickness between the patterned region 101A and the unpatterned region 101B of the tungsten-containing layer 111 at the start of method 1000. However, at the first completion of block 2010, there is more remaining material in the tungsten-containing layer 111 of the patterned region 101A and the unpatterned region 101B relative to the completion of block 1010 of FIG. 3. To remove this additional material, blocks 2004 to 2010 (see FIGS. 6B and 6C) are repeated one or more times, such as between 1 and about 20 times, such as about 10 times. In some embodiments, the reduced removal of the tungsten-containing layer 111 of the patterned region 101A and the unpatterned region 101B in block 2006 relative to block 1006 is due to a shorter duration of block 2010 relative to block 1010.

At block 2011, a determination is made as to whether a desired thickness of the tungsten-containing layer 111 in the patterned region 101A and/or the unpatterned region 101B has been reached by the removal of portions of the tungsten-containing layer 111 in blocks 2004-2010. If the desired thickness has not been reached, then blocks 2004-2010 can be repeated in succession to remove additional material from the tungsten-containing layer 111. If the desired thickness has been reached, then a third plasma can be generated to remove the remaining portions of the tungsten-containing layer 111 in the patterned region 101A and the unpatterned region 101B. Using a repetitive process of blocks 2004-2010 to incrementally remove portions of the tungsten-containing layer 111, for example by using multiple shorter durations of blocks 2004-2010 performed in a cyclic fashion, as opposed to executing 2004-2010 once (i.e., the process used in method 1000 of FIG. 3), to remove a comparable overall portion of the tungsten-containing layer 111, can help to reduce particle generation in the process volume 201. For example, removing 100 nm or more of the tungsten-containing layer with one execution of blocks 2004-2010 (i.e., in one cycle) can cause particle generation and/or damage the device 100 being processed due to the extended length of the processing blocks. Furthermore, using the repetitive process with shorter durations for the first plasma can help reduce the variations in the profile, properties and/or composition of the first film 116 across the patterned region 101A, which can help promote achieving more uniform and consistent results at the end of the method 2000 for forming the patterned device 100'.

At block 2012, a third plasma of the gases provided to the process volume 201 of the process chamber 200 is generated after generating the second plasma. In some embodiments, the gases provided to the process volume 201 of the process chamber 200 for the third plasma are different gases or different flowrates of gases relative to the gases and flowrates provided to the process volume 201 of the process chamber 200 for the first plasma and second plasma. Furthermore, the electrical characteristics for the power provided to the antenna 248 and/or for the power provided to the electrode 221 may be different at block 2012 for generating the third plasma relative to block 2004 for generating the first plasma and relative to block 2008 for generating the second plasma. The third plasma generated in block 2012 can be generated using the same process conditions as those described above for the third plasma generated in block 1012 of FIG. 3. Exemplary process conditions to form the second plasma can also be found above in Table 3.

Referring to FIGS. 5 and 6D, at block 2014, remaining portions of the patterned region 101A and the unpatterned region 101B of the tungsten-containing layer 111 are removed with the third plasma to expose a top surface of the supporting layer 112 (i.e., the surface previously covered by the tungsten-containing layer 111). At the completion of block 2014, the tungsten-containing layer 111 can be fully removed to form the patterned device 100' of FIG. 6D without removing and/or damaging any underlying layers, such as supporting layer 112. In some embodiments, a negligible amount of an underlying layer, such as the supporting layer 112, is removed in one or more of the patterned region 101A and/or the unpatterned region 101B. For example, a thickness of the supporting layer 112 after generation of the third plasma within 0.5% of the thickness of the supporting layer 112 before generation of the first plasma is considered a negligible amount. The process conditions for the third plasma can be selected to selectively remove the tungsten-containing layer 111 (e.g., WC) relative to the supporting layer 112 (e.g., silicon oxide) at ratio is greater than 100:1, such as greater than 300:1, such as even greater than 1000:1.

Overall, the methods described above provide solutions to overcoming the problem presented by removing a tungsten-containing layer disposed over a patterned device when the thickness of the tungsten-containing layer varies between a patterned region and an unpatterned region of the patterned device. These problems are overcome by (1) generating a first plasma to deposit a film over the patterned region of the tungsten-containing layer in the patterned region while removing portions of the tungsten-containing layer in the unpatterned region, followed by (2) generating a second plasma to remove the deposited film while also removing portions of the tungsten-containing layer in the patterned region and the unpatterned region that significantly reduces the initial thickness variation of the tungsten-containing layer between the patterned region and the unpatterned region, followed by (3) generating a third plasma to remove the remaining portions of the tungsten-containing layer in both the patterned region and the unpatterned region without any removal or damage to any underlying layers.

While the foregoing is directed to embodiments of the present disclosure, other and further embodiments of the disclosure may be devised without departing from the basic scope thereof, and the scope thereof is determined by the claims that follow.

The invention claimed is:

1. A method of removing a layer from a substrate, comprising:
generating a first plasma in a process volume of a plasma chamber, wherein
a patterned device is disposed on a substrate support in the process volume, the patterned device comprising:
a substrate; and
a layer formed over the substrate, wherein the layer comprises one or more of a carbide, nitride, oxide, silicide, or a boride, and the layer comprising a patterned region and an unpatterned region, wherein the patterned region includes a plurality of patterned features;
depositing a first film over the patterned region of the layer with the first plasma; and
removing portions of the unpatterned region of the layer with the first plasma without depositing the first film over the unpatterned region.

2. The method of claim 1, wherein the plurality of patterned features includes a plurality of high aspect ratio features having an aspect ratio of at least 2:1.

3. The method of claim 2, wherein the unpatterned region is substantially flat.

4. The method of claim 1, wherein a thickness of the unpatterned region of the layer is greater than a thickness of the patterned region of the layer before generation of the first plasma.

5. The method of claim 1, further comprising:
generating a second plasma in the process volume of the plasma chamber after generating the first plasma; and
removing the first film and portions of the patterned region and the unpatterned region of the layer with the second plasma.

6. The method of claim 5, wherein a difference in thickness between the unpatterned region and the patterned region after the generation of the second plasma is less than a difference in the thickness between unpatterned region and the patterned region before the generation of the first plasma.

7. The method of claim 5, further comprising:
generating a third plasma in the process volume of the plasma chamber after generating the second plasma; and
removing remaining portions of the patterned region and the unpatterned region of the layer with the third plasma to expose a top surface of a supporting layer disposed between the layer and the substrate.

8. The method of claim 7, wherein the supporting layer comprises silicon nitride or silicon oxide.

9. The method of claim 7, wherein a thickness of the supporting layer after generation of the third plasma is within 0.5% of the thickness of the supporting layer before generation of the first plasma.

10. The method of claim 5, further comprising
repeating the generation of the first plasma and the second plasma in succession after a first generation of the second plasma;
removing additional portions of the unpatterned region of the layer with the repeated first plasma; and
removing additional portions of the patterned region and the unpatterned region of the layer with the repeated second plasma.

11. The method of claim 7, further comprising
repeating the generation of the first plasma and the second plasma in succession after a first generation of the second plasma and before generation of the third plasma;
removing additional portions of the unpatterned region of the layer with the repeated first plasma; and
removing additional portions of the patterned region and the unpatterned region of the layer with the repeated second plasma.

12. The method of claim 1, wherein the layer comprises a metal and the first film includes at least one metal from the layer.

13. A method of removing a layer from a substrate, comprising:
generating a first plasma in a process volume of a plasma chamber, wherein
a patterned device is disposed on a substrate support in the process volume, the patterned device comprising:
a substrate; and
a layer formed over the substrate, wherein the layer comprises one or more of a carbide, nitride, oxide, silicide, or a boride, the layer comprising a patterned region including changes in thickness of the layer of at least 20% and an unpatterned region without any changes in thickness greater than 10%;
depositing a first film over the patterned region of the layer with the first plasma; and
removing portions of the unpatterned region of the layer with the first plasma without depositing the first film over the unpatterned region.

14. The method of claim 13, further comprising
supplying a first gas comprising oxygen, a second gas comprising chlorine, and a third gas comprising hydrogen to the process volume of the plasma chamber, wherein the first plasma comprises a plasma of the first gas, the second gas, and the third gas.

15. The method of claim 14, wherein the layer comprises a metal and the first film comprises an oxide including at least one metal from the layer.

16. The method of claim 13, wherein the layer comprises a metal-containing carbide, a metal-containing carbon nitride, or a metal-containing nitride.

17. The method of claim 13, further comprising:
generating a second plasma in the process volume of the plasma chamber after generating the first plasma; and
removing the first film and portions of the patterned region and the unpatterned region of the layer with the second plasma.

18. The method of claim 17, wherein an RF bias is supplied to the substrate support at a first power level during the generation of the first plasma and the RF bias is supplied to the substrate support at a second power level during generation of the second plasma, wherein the first power level is different from the second power level.

19. The method of claim 17, further comprising:
generating a third plasma in the process volume of the plasma chamber after generating the second plasma; and
removing remaining portions of the patterned region and the unpatterned region of the layer with the third plasma to expose a top surface of a supporting layer disposed over the substrate.

20. A method of removing a layer from a substrate, comprising:
generating a first plasma in a process volume of a plasma chamber, wherein
a patterned device is disposed on a substrate support in the process volume, the patterned device comprising:
a substrate; and
a layer formed over the substrate, wherein
the layer comprises one or more of a carbide, nitride, oxide, silicide, or a boride, the layer comprising a patterned region and an unpatterned region, and;
depositing a first film over the patterned region of the layer with the first plasma to form a plurality of voids; and
removing portions of the unpatterned region of the layer with the first plasma without depositing the first film over the unpatterned region with the first plasma.

* * * * *